United States Patent
Lin et al.

(10) Patent No.: US 8,183,087 B2
(45) Date of Patent: May 22, 2012

(54) SEMICONDUCTOR DEVICE AND METHOD OF FORMING A FAN-OUT STRUCTURE WITH INTEGRATED PASSIVE DEVICE AND DISCRETE COMPONENT

(75) Inventors: Yaojian Lin, Singapore (SG); Jianmin Fang, Singapore (SG); Kang Chen, Singapore (SG); Haijing Cao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 596 days.

(21) Appl. No.: 12/207,332

(22) Filed: Sep. 9, 2008

(65) Prior Publication Data

US 2010/0059855 A1 Mar. 11, 2010

(51) Int. Cl.
*H01L 21/00* (2006.01)
(52) U.S. Cl. .............. 438/106; 438/107; 257/E21.008
(58) Field of Classification Search .......... 438/106, 438/107; 257/528, 724, 723, 700, 690, E21.008, 257/E23.012
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,475,240 A * | 12/1995 | Sakamoto | 257/67 |
| 5,841,193 A | 11/1998 | Eichelberger | |
| 7,619,901 B2 | 11/2009 | Eichelberger et al. | |
| 2007/0114651 A1* | 5/2007 | Marimuthu et al. | 257/690 |
| 2008/0017907 A1* | 1/2008 | Otremba | 257/306 |
| 2008/0316714 A1* | 12/2008 | Eichelberger et al. | 361/728 |
| 2009/0236686 A1* | 9/2009 | Shim et al. | 257/528 |
| 2009/0302439 A1* | 12/2009 | Pagaila et al. | 257/660 |
| 2009/0309212 A1* | 12/2009 | Shim et al. | 257/700 |

* cited by examiner

*Primary Examiner* — Chuong A Luu
*Assistant Examiner* — Nga Doan
(74) *Attorney, Agent, or Firm* — Robert D. Atkins; Patent Law Group: Atkins & Associates, P.C.

(57) ABSTRACT

A semiconductor device is made by providing a temporary carrier for supporting the semiconductor device. An integrated passive device (IPD) is mounted to the temporary carrier using an adhesive. The IPD includes a capacitor and a resistor and has a plurality of through-silicon vias (TSVs). A discrete component is mounted to the temporary carrier using the adhesive. The discrete component includes a capacitor. The IPD and the discrete component are encapsulated using a molding compound. A first metal layer is formed over the molding compound. The first metal layer is connected to the TSVs of the IPD and forms an inductor. The temporary carrier and the adhesive are removed, and a second metal layer is formed over the IPD and the discrete component. The second metal layer interconnects the IPD and the discrete component and forms an inductor. An optional interconnect structure is formed over the second metal layer.

16 Claims, 12 Drawing Sheets

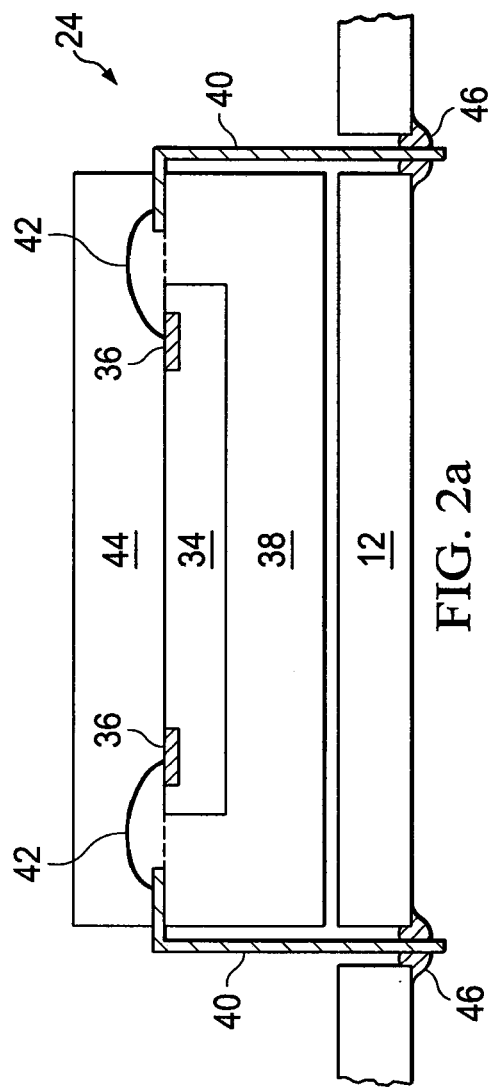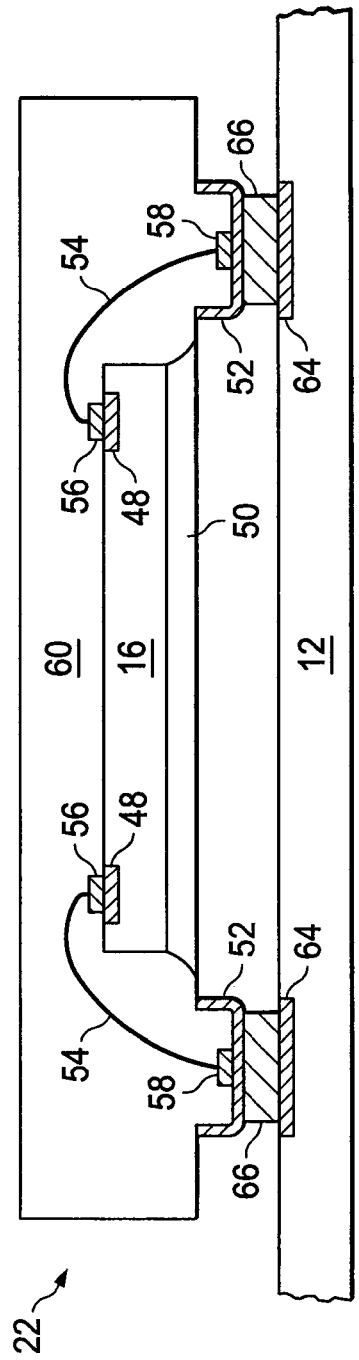
FIG. 2a
FIG. 2b

SEMICONDUCTOR DEVICE AND METHOD OF FORMING A FAN-OUT STRUCTURE WITH INTEGRATED PASSIVE DEVICE AND DISCRETE COMPONENT

FIELD OF THE INVENTION

The present invention relates in general to semiconductor devices and, more particularly, to a semiconductor device having an integrated passive device (IPD) and one or more passive or discrete elements connected to the IPD.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, semiconductor devices combine analog and digital circuitry. To simplify fabrication, the devices are often implemented by combining an integrated passive device (IPD) chip with other circuitry to provide the necessary functionality. Although the IPD provides a convenient mechanism for combing passive devices including capacitors, resistors and inductors for use in analog circuits, the IPD is not a convenient mechanism for providing passive devices for use in digital circuits. Digital circuits require relatively large value capacitors, for example, that are difficult to form in IPDs due to their volume constraints. Because the maximum capacity of passive devices provided by an IPD is limited by the two-dimensional layout of IPDs, the benefits provided by IPDs are quickly minimized when they are implemented in systems using both digital and analog circuits.

SUMMARY OF THE INVENTION

In one embodiment, the present invention is a method of making a semiconductor device comprising the steps of providing a temporary carrier for supporting the semiconductor device, and mounting an integrated passive device (IPD) to the temporary carrier using an adhesive. The IPD includes a capacitor and a resistor and has a plurality of through-silicon vias (TSVs). The method includes mounting a discrete component to the temporary carrier using the adhesive. The discrete component includes a capacitor. The method includes encapsulating the IPD and the discrete component using a molding compound, and forming a first metal layer over the molding compound. The first metal layer is connected to the TSVs of the IPD and forms an inductor. The method includes removing the temporary carrier and the adhesive, and forming a second metal layer over the IPD and the discrete component. The second metal layer interconnects the IPD and the discrete component and forms an inductor. The method includes forming an interconnect structure over the second metal layer.

In another embodiment, the present invention is a method of making a semiconductor device comprising the step of providing an integrated passive device (IPD). The IPD includes a capacitor and a resistor and has a plurality of through-silicon vias (TSVs). The method includes providing a discrete component disposed proximate to the IPD. The discrete component includes a capacitor. The method includes encapsulating the IPD and the discrete component using a molding compound, and forming a first metal layer over the molding compound. The first metal layer is connected to the TSVs of the IPD and forms an inductor. The method includes forming a second metal layer over the IPD and the discrete component. The second metal layer interconnects the IPD and the discrete component. The method includes forming an interconnect structure over the second metal layer.

In another embodiment, the present invention is a method of making a semiconductor device comprising the steps of providing an integrated passive device (IPD), providing a discrete component disposed proximate to the IPD, and forming a metal layer over the IPD and the discrete component. The metal layer interconnects the IPD and the discrete component. The method includes forming an interconnect structure over the semiconductor device.

In another embodiment, the present invention is a semiconductor device comprising a semiconductor die having an integrated passive device (IPD). The IPD includes a capacitor and a resistor and has a plurality of through-silicon vias (TSVs). The device includes a discrete component disposed proximate to the IPD. The discrete component includes a capacitor. The device includes a molding compound disposed over the IPD and the discrete component, and a first metal layer formed over the molding compound. The first metal layer is connected to the TSVs of the IPD and forms an inductor. The device includes a second metal layer formed over the IPD and the discrete component. The second metal layer interconnects the IPD and the discrete component. The device includes an interconnect structure formed over the second metal layer.

BRIEF DESCRIPTION OF THE DRAWINGS

FIGS. 2a-2c illustrate further detail of the representative semiconductor packages mounted to the PCB;

DETAILED DESCRIPTION OF THE DRAWINGS

Figure 1:
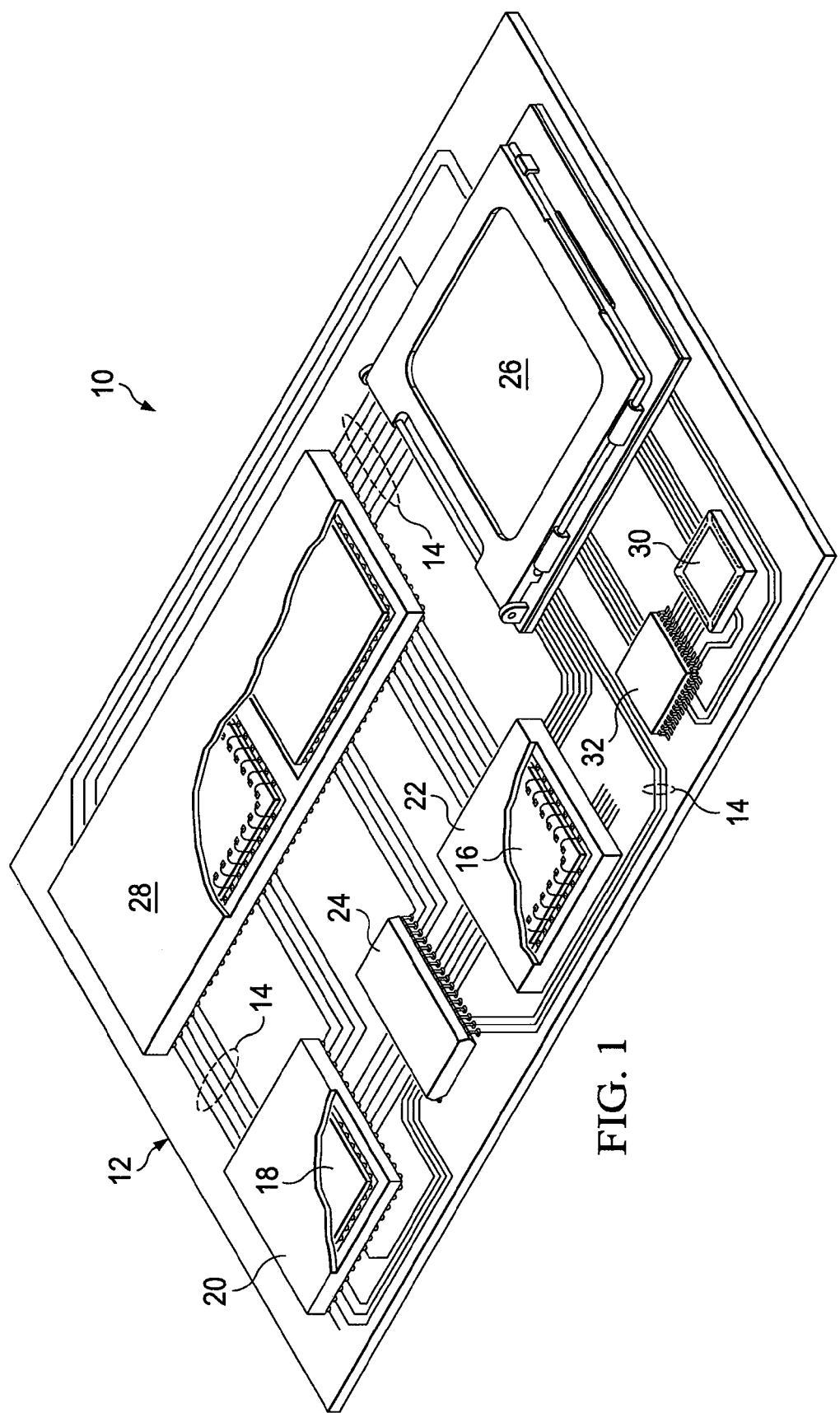
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
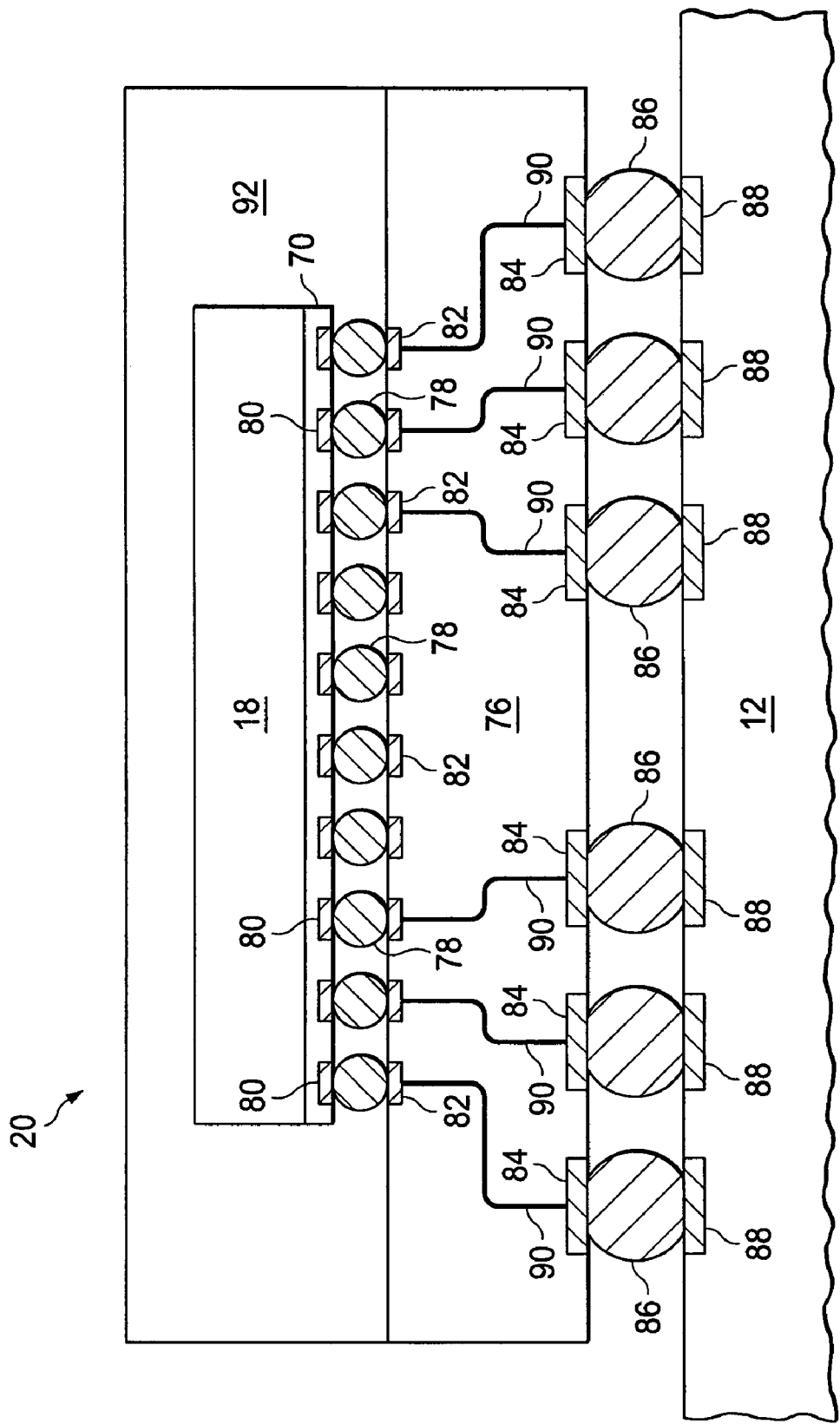

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

FIGS. 3*a*-3*e* illustrate a method of forming a semiconductor device 100 having a fan-out integrated passive device (IPD) structure. IPD 102 is mounted to temporary carrier 104 using adhesive 106. Carrier 104 includes a stiff material such as a glass or metal wafer or flexible tape and facilitates the build-up process performed over a top surface of carrier 104. Carrier 104 may be coated with a light, heat or laser releasable layer for device mounting and removal. Adhesive 106 is deposited using spin coating, or printing, and may include a laminated polymer adhesive or an ultra-violet (UV) curable liquid adhesive. Adhesive 106 is light, heat or mechanically releasable.

Figure 3A:
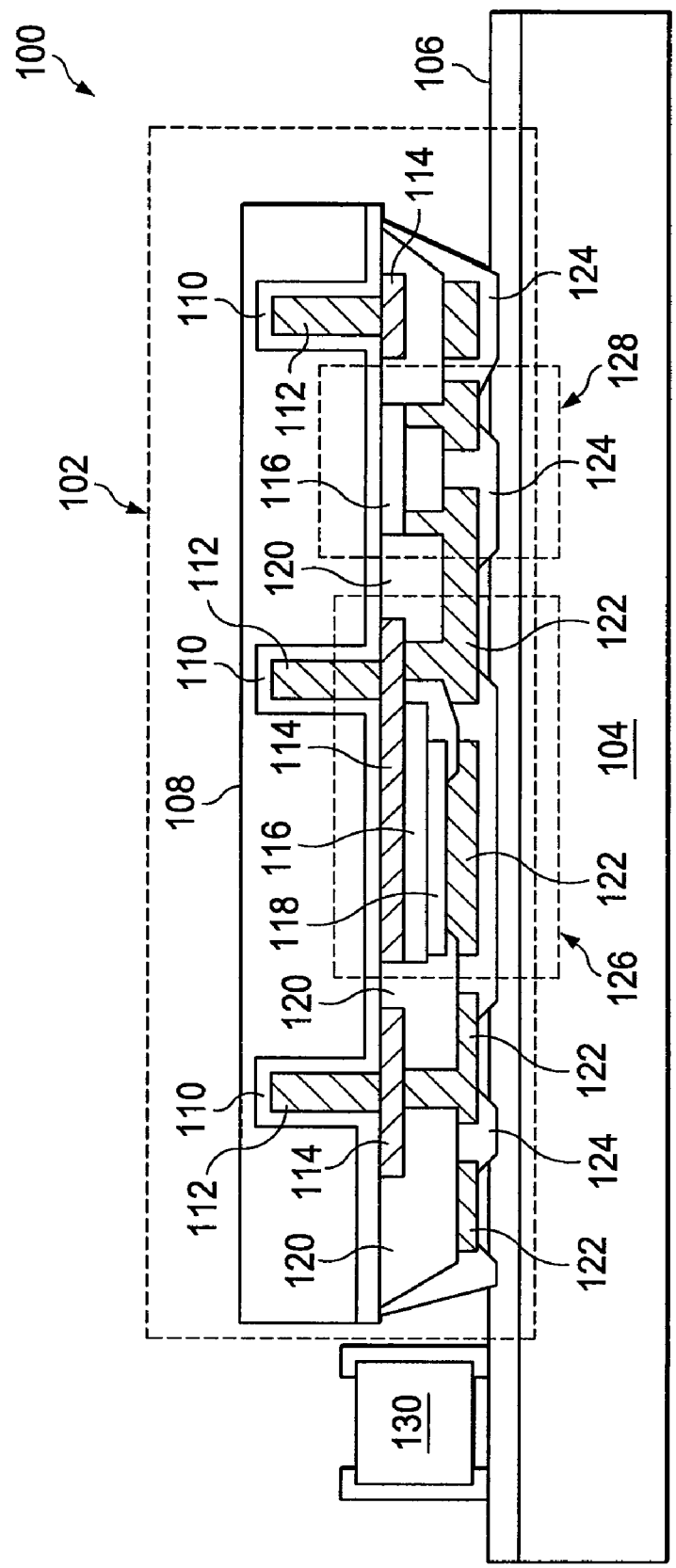
FIGS. 3a-3e illustrate a method of forming a semiconductor device having a fan-out structure with an integrated passive device (IPD)

IPD 102 is pre-fabricated and includes metal, resistive and dielectric layers to form various passive devices for integrating into semiconductor device 100. In one embodiment, IPD 102 includes a plurality of passive circuit elements. In the present embodiment, IPD 102 includes a capacitor and resistor. As shown in FIG. 3*a*, IPD 102 includes semiconductor substrate 108. Substrate 108 includes a semiconducting substrate material such as silicon (Si). Vias are formed in substrate 108 using deep reactive ion etching (DRIE), laser drilling, or another etching process. An optional insulation layer 110 is formed conformally over a surface of substrate 108 into the vias and includes one or more layers of silicon dioxide (SiO2), silicon nitride (Si3N4), silicon oxynitride (SiON), or another insulating material. The deposition of insulation layer 110 involves PVD or CVD. A metal material is deposited into the vias to form through-silicon vias (TSVs) 112. TSVs 112 may be blind or may be exposed at the backside of substrate 108. Metal in TSVs 112 are formed using an evaporation, electrolytic plating, electroless plating, screen printing, or another suitable metal deposition process. Metal in TSVs 112 can be made with Al, Cu, Sn, Ni, Au, or Ag or another conductive material suitable for deposition. In alternative embodiments, TSVs 112 are either filled with a conductive material, or coated with a conformal layer of conductive material.

Metal layer 114 is deposited over insulation layer 110 and TSVs 112. Metal layer 114 and metal in TSVs 112 may be formed concurrently, with a single layer of metal forming both metal in TSVs 112 and metal layer 114. Resistive layer 116 is deposited over metal layer 114 and insulation layer 110 and includes tantalum silicide (TaxSiy) or other metal silicides, TaN, nichrome (NiCr), TiN, or doped poly-silicon. Dielectric layer 118 is deposited over resistive layer 116. Dielectric layer 118 can be silicon nitride (SiN), tantalum oxide (Ta2O5), hafnium oxide (HfO2), or a dielectric film material. Insulation layer 120 is deposited over insulation layer 110, metal layer 114, resistive layer 116, and dielectric layer 118. Metal layer 122 includes a conductive material and is deposited over insulation layer 120 using a PVD, CVD, electrolytic plating, or electroless plating process.

The combination of metal, insulation, dielectric, and resistive layers form one or more passive devices within IPD 102. Box 126 shown on FIG. 3*a* indicates a capacitor structure formed in IPD 102 that includes portions of metal layer 114, resistive layer 116, dielectric layer 118 and metal layer 122. Box 128 indicates a resistor structure that includes portions of resistive layer 116 and metal layer 122. In alternative embodiments, IPD 102 may include different combinations of passive devices, radio-frequency (RF) circuitry, or other electronic circuits to provide the necessary functionality of semiconductor device 100. Insulation layer 124 is deposited over IPD 102 to provide electrical isolation and physical protection to the devices formed within IPD 102. After IPD 102 is fabricated, it is inverted and mounted to carrier 104 using adhesive 106.

Depending upon the application, additional discrete devices or components may be added to semiconductor device 100. The discrete components include resistors, capacitors, inductors, or other passive or active circuit components. In FIG. 3*a*, discrete component 130 includes a discrete capacitor and is mounted to carrier 104 using adhesive 106. In one embodiment, capacitor 130 has a capacitance value over 100 picofarads (pF).

Figure 3B:
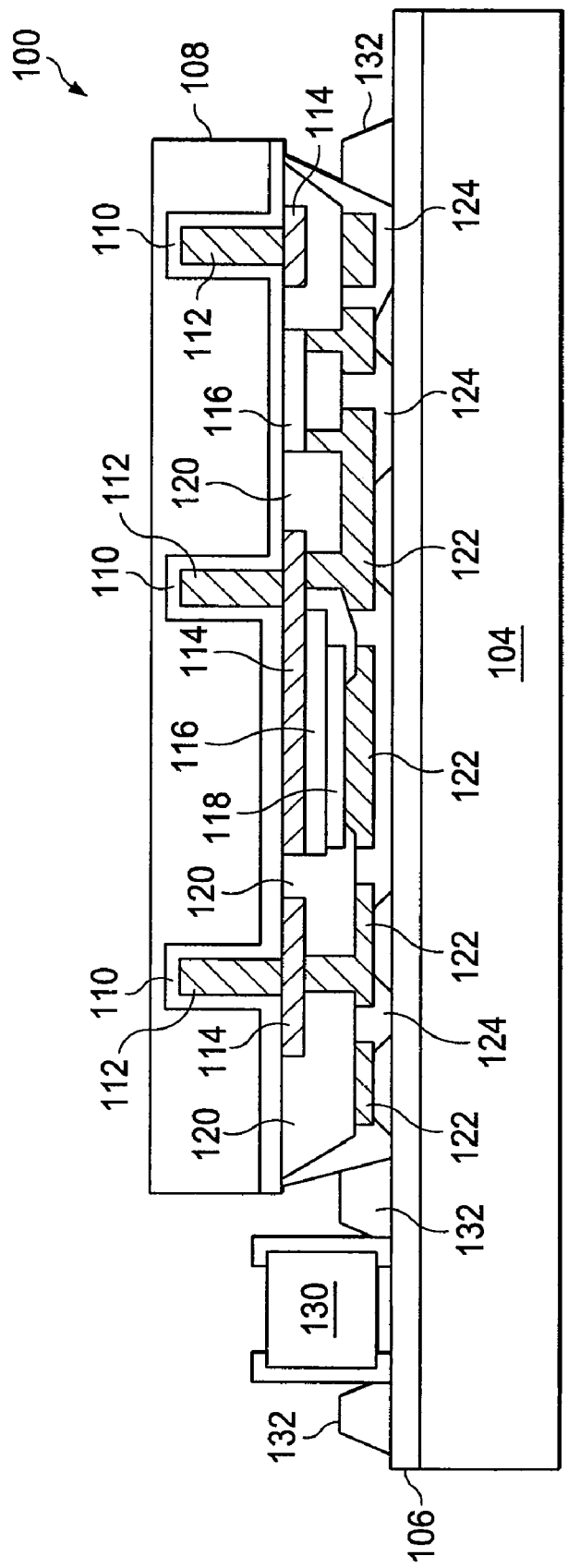

FIG. 3*b* illustrates an optional step for mounting IPD 102 to carrier 104. Photoresist 132 is deposited and patterned over carrier 104 to act as a guide to facilitate the mounting of IPD 102 within a specific location. Photoresist 132 also facilitates the positioning of discrete components such as capacitor 130 over carrier 104. After wafer-level molding, photoresist 132 may be removed. Alternatively, photoresist 132 is not removed and instead forms a seal ring around a surface of IPD 102 and the discrete components. In IPD 102, the seal is formed with photoresist 132 and either insulation layer 124, insulation layer 120, or metal layer 122 depending upon which is the top-most layer of IPD 102. By forming a seal ring around IPD 102 and the discrete devices, potential seepage of molding compound over the device contact pads or IPD 102 is minimized.

Figure 3C:
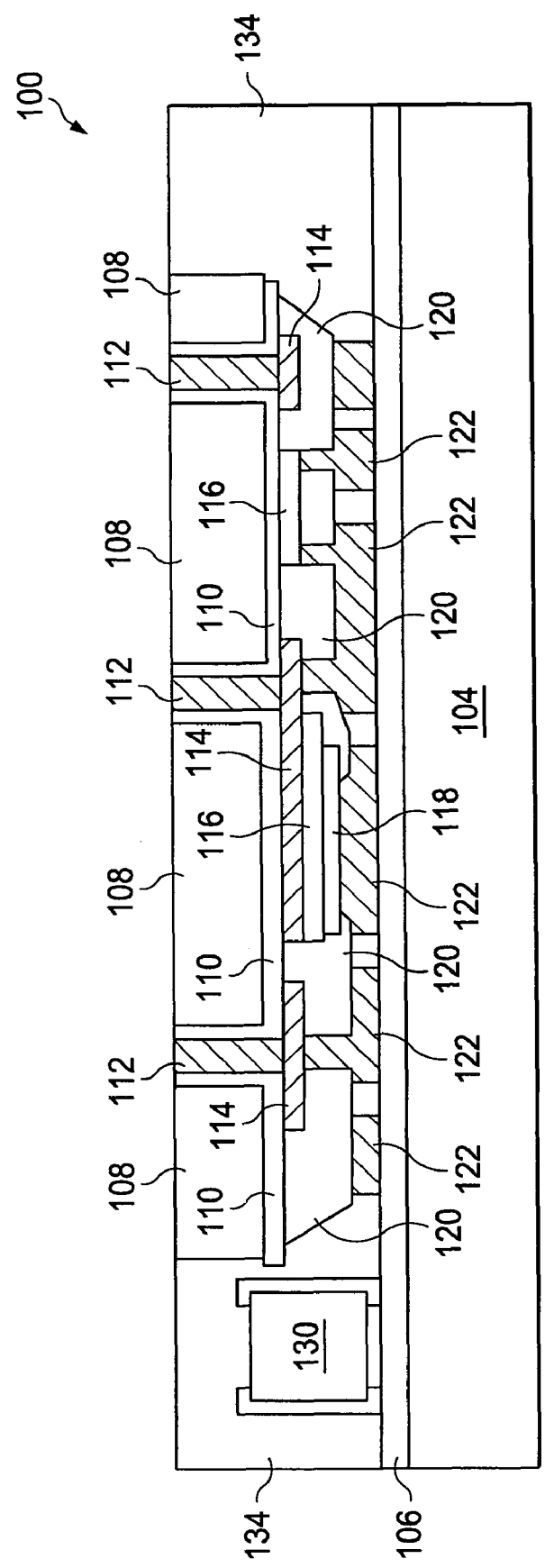

In FIG. 3*c*, wafer encapsulation of semiconductor device 100 is performed to encapsulate both IPD 102 and capacitor 130. Encapsulant 134 includes epoxy acrylate, other polymer materials or molding compounds with proper fillers and is applied by transfer molding, liquid encapsulant molding, or other molding processes or vacuum lamination. Encapsulant 134 is non-conductive and environmentally protects the semiconductor device from external elements and contaminants. An optional backgrinding process is used to remove the backside of IPD 102 to expose TSVs 112. The backgrinding process may involve chemical-mechanical polishing (CMP), wet etching, or plasma etching. Alternatively, encapsulant 134 may be vacuum laminated to encapsulate both IPD 102 and capacitor 103.

Figure 3D:
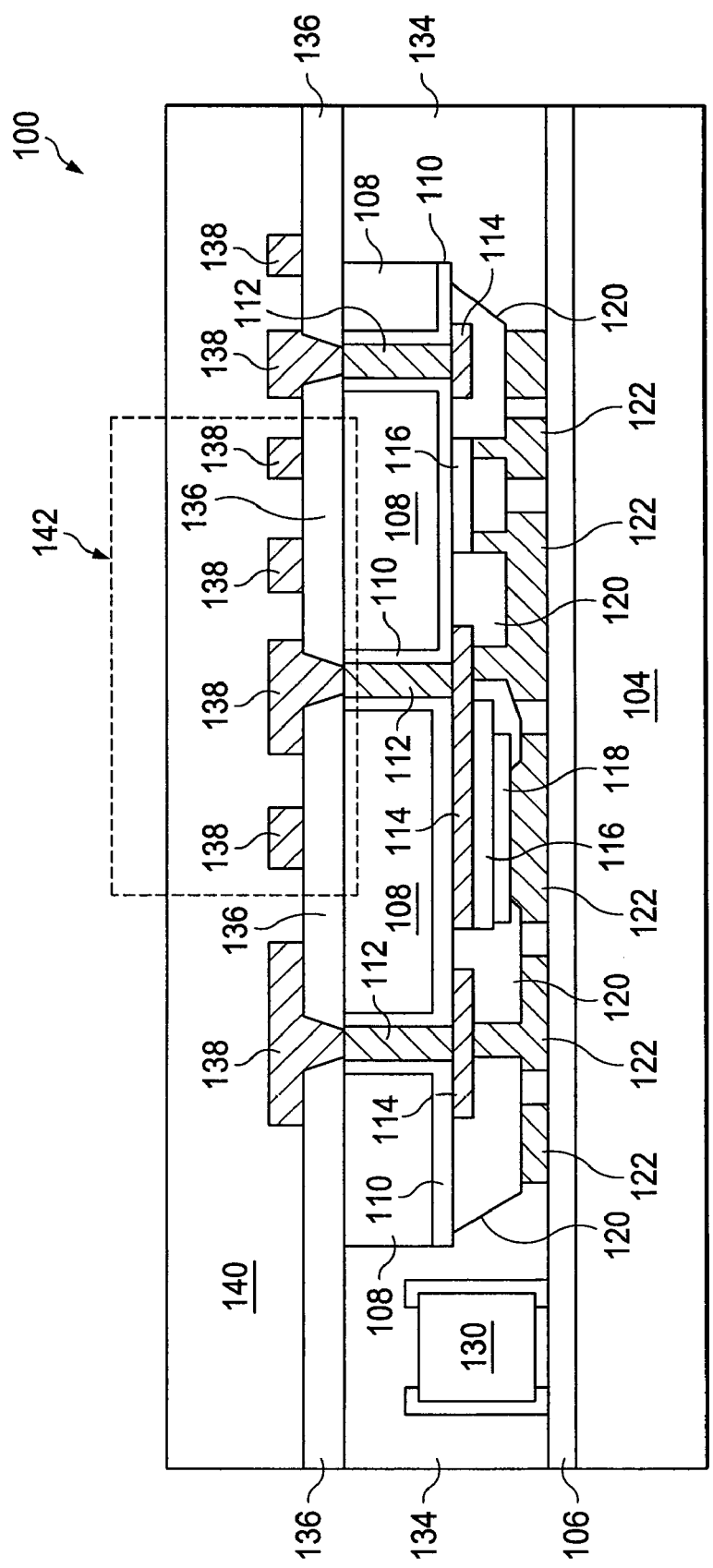

Turning to FIG. 3d, insulation and metal layers are formed over a backside of IPD 102 to form an interconnection network and/or other passive circuit elements. Insulation layer 136 is deposited over a backside of IPD 102 using spin coating, printing, laminating, or molding. Insulation layer 136 is typically a photo-sensitive polymer material. Insulation layer 136 is patterned and cured to expose portions of TSVs 112. Metal layer 138 is deposited and patterned over insulation layer 136. Portions of metal layer 138 are deposited over the patterned regions of insulation layer 136 and are electrically connected to TSVs 112. Insulation layer or molding compound 140 is deposited over metal layer 138 and insulation layer 136. Insulation layer 140 is typically a photo-sensitive polymer material. Alternatively, insulation layer 140 may include a filler material such as glass fibers to improve strength and durability. Insulation layer 140 can be spin coated, printed, molded or laminated. As shown in FIG. 3d, portions of metal layer 138 form an inductor structure as indicated by box 142. Additional insulation and metal layers may be formed between metal layer 138 and insulation layer 140 for other purposes, such as grounding or electro-magnetic interference (EMI) shielding. Depending upon the application and the thickness of semiconductor device 100 and molding 134, carrier 104 and adhesive 106 may optionally be removed before deposition of insulation layers 136 and 140 and metal layer 138.

Figure 3E:
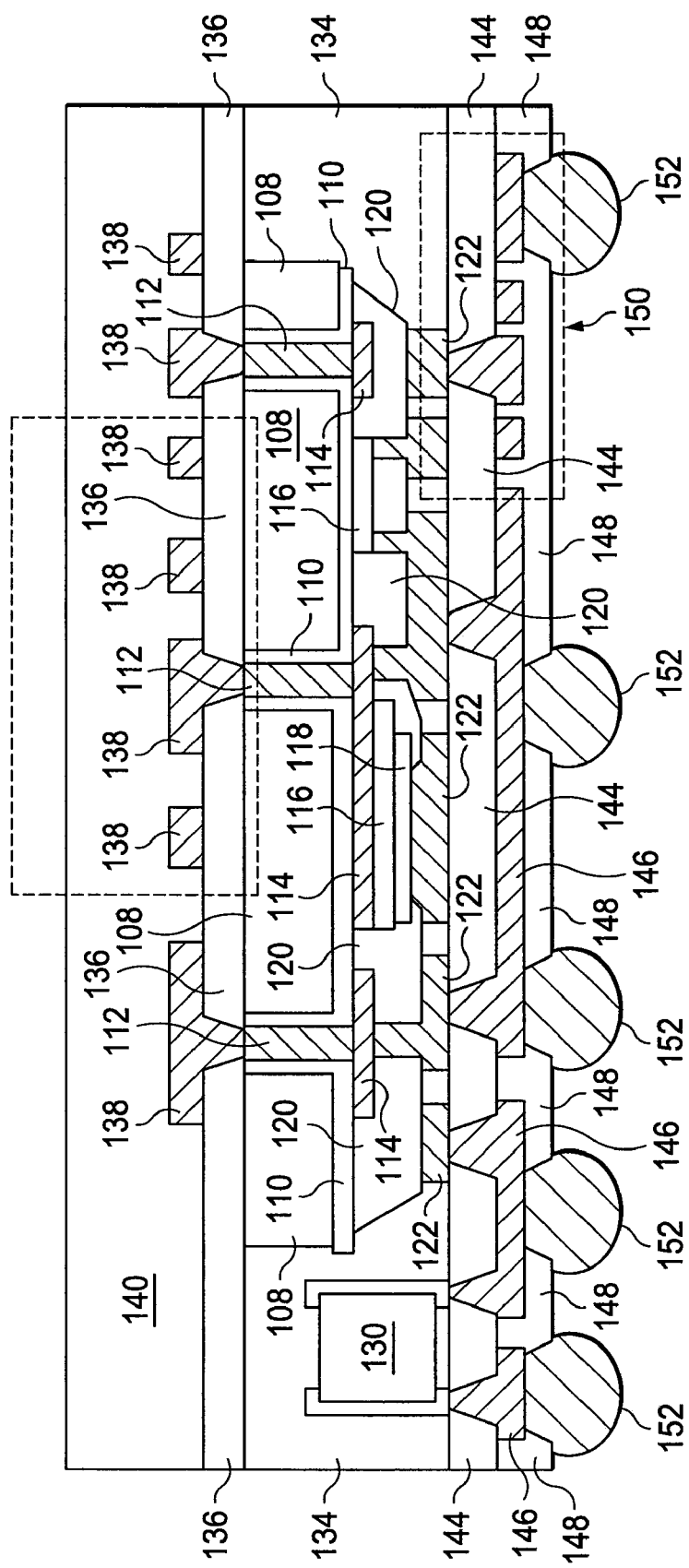

Turning to FIG. 3e, carrier 104 and adhesive 106 are removed. Insulation layer 144 is deposited and patterned over IPD 102. Insulation layer 144 is patterned to expose portions of metal layer 122. Metal layer 146 is deposited over insulation layer 144 and is electrically connected to metal layer 122. Insulation layer 148 is deposited over metal layer 146 and is patterned to expose portions of metal layer 146. Metal layer 146 is used to interconnect discrete passive devices (including capacitor 130) and other components of semiconductor device 100 and the circuitry formed within IPD 102. Furthermore, metal layer 146 may form additional electronic devices such as a ground plane, or an additional inductor (indicated by box 150 shown on FIG. 3e).

After deposition of insulation layer 148, an interconnect structure is formed over the backside of semiconductor device 100. As shown in FIG. 3e, the interconnect structure includes a plurality of solder bumps 152 formed over insulation layer 148 in electrical communication with metal layer 146. Bumps 152 include an electrically conductive material such as a solder material or other electrically conductive material, e.g., Sn, Pb, Au, Ag, Cu, Zn, Bi, and alloys thereof, with an optional flux material. For example, the solder material can be eutectic Sn/Pb, high lead, or lead free. The solder material is deposited over the patterned regions of insulation layer 148 and is reflowed to form bumps 152. In alternative embodiments, other interconnect structures such as stud bumping, wirebonds or conductive pillars are connected to semiconductor device 100 to allow for the connection of external system components.

Using the above method a semiconductor device having a fan-out IPD structure is fabricated. The semiconductor device includes an integrated IPD. The IPD includes a plurality of passive circuit elements that are electrically connected to other devices and/or circuit elements formed within the semiconductor device. In one embodiment, the IPD is connected to discrete passive components that provide relatively large value capacitance values. By combining an IPD with other discrete circuit components, the relative size of the IPD is minimized while providing the necessary functionality to implement both analog and digital circuitry. A three-dimensional (3D) RF circuit is fabricated over the IPD using TSVs formed within the IPD in combination with wafer-level packaging technology. An inductor is formed separately from the capacitors of the semiconductor device over a different surface of the IPD. The inductor is interconnected with the capacitor and other circuit elements using the TSVs formed within the IPD. In some embodiment, the circuit form factor is effectively reduced with improved ESD performance.

Figure 4:
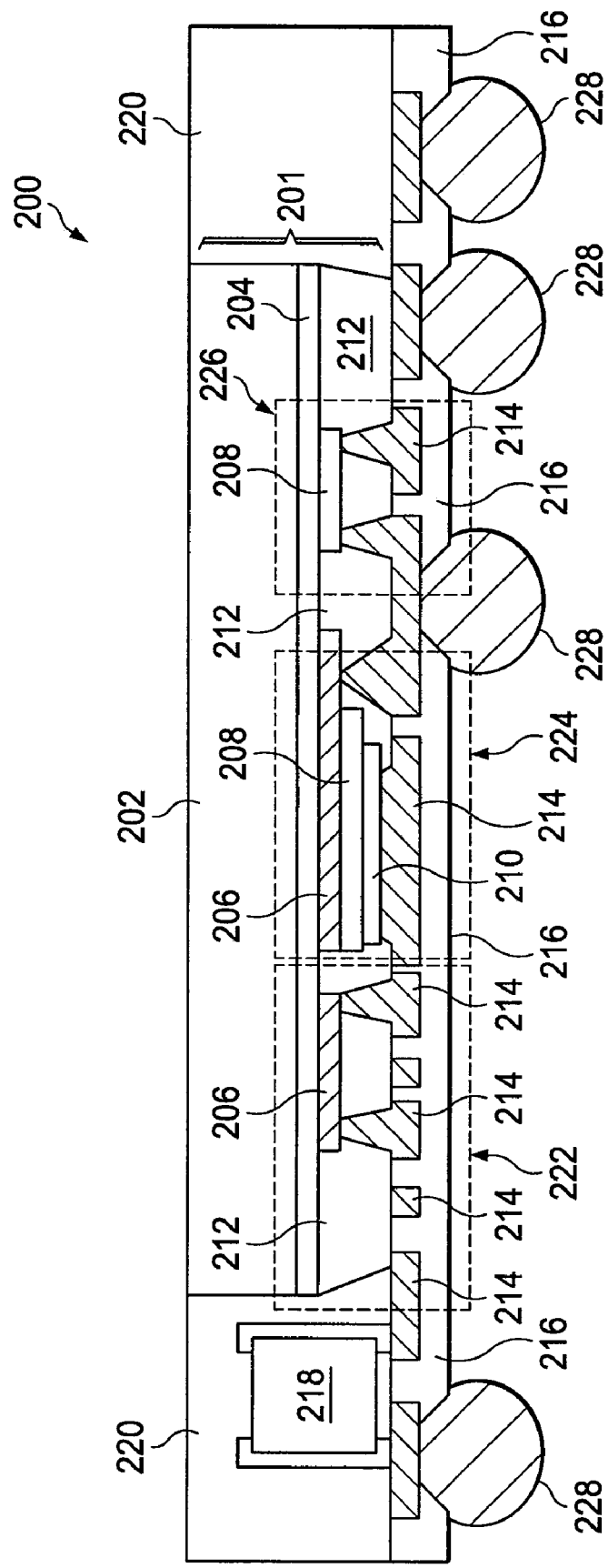
FIG. 4 illustrates a semiconductor device having a fan-out IPD structure, the IPD does not include TSVs and is connected to a discrete component.

FIG. 4 illustrates semiconductor device 200 having a fan-out IPD structure, the IPD does not include TSVs. Semiconductor device 200 includes IPD 201. IPD 201 includes a plurality of passive circuit elements for integrating into the analog circuitry of semiconductor device 200. In the present embodiment, IPD 201 includes a capacitor and resistor. As shown in FIG. 4, IPD 201 includes semiconductor substrate 202. Substrate 202 includes a semiconducting substrate material such as Si or Si with active or passive circuits. Insulation layer 204 is formed conformally over a surface of substrate 202 and includes one or more layers of SiO2, Si3N4, SiON, or another insulating material. The deposition of insulation layer 204 involves PVD or CVD. Metal layer 206 is deposited over insulation layer 204. Resistive layer 208 is deposited over metal layer 206 and insulation layer 204 and includes TaxSiy or other metal silicides, TaN, NiCr, TiN, or doped polysilicon. Dielectric layer 210 is deposited over resistive layer 208. Dielectric layer 210 can be SiN, Ta2O5, HfO2, or a dielectric film material. Insulation layer 212 is deposited over insulation layer 204, metal layer 206, resistive layer 208, and dielectric layer 210.

Depending upon the application, discrete components may be added to semiconductor device 200 to provide additional functionality. For example, with reference to FIG. 4, discrete component 218 is mounted next to IPD 201. Discrete component 218 includes passive or active components such as resistors, capacitors, inductors, or other electronic components.

Encapsulant 220, such as a molding compound, is deposited over IPD 201 and discrete component 218. Encapsulant 220 includes epoxy acrylate, other polymer material with proper fillers, or molding compounds and is applied by transfer molding, liquid encapsulant molding, or other molding processes. Component 281 and IPD 201 are mounted to a temporary wafer carrier before encapsulation with 220. Metal layer 214 is deposited and patterned over encapsulant 220 and insulation layer 212 using a PVD, CVD, electrolytic plating, or electroless plating process after removing temporary carrier and adhesive layer for mounting. Metal layer 214 electrically interconnects IPD 201 and discrete component 218. Insulation layer 216 is deposited and patterned over metal layer 214 to expose portions of metal layer 214. The combination of metal, insulation, dielectric, and resistive layers form one or more passive devices within device 200. Box 222 shown on FIG. 4 indicates an inductor structure formed by metal layer 214 deposited over IPD 201. Box 224 indicates a capacitor structure that includes portions of metal layer 206, resistive layer 208, dielectric layer 210 and metal layer 214. A portion of metal layer 214 forms the top electrode plate of the capacitor. Box 226 indicates a resistor structure that includes portions of resistive layer 208 and metal layer 214.

An interconnect structure is formed over insulation layer 216. Bumps 228 include an electrically conductive material such as a solder material or other electrically conductive material, e.g., Sn, Pb, Au, Ag, Cu, Zn, Bi, and alloys thereof, with an optional flux material. For example, the solder material can be eutectic Sn/Pb, high lead, or lead free. The solder material is deposited over the patterned regions of insulation layer 216 and is reflowed to form bumps 228. In alternative embodiments, other interconnect structures such as stud bumping, wirebonds or conductive pillars are formed over semiconductor device 200 to allow for the connection of external system components. In the present embodiment, the patterned regions of insulation layer 216 define the pad size for flip-chip or wirebonding interconnect to other system components or packages.

Figure 5:
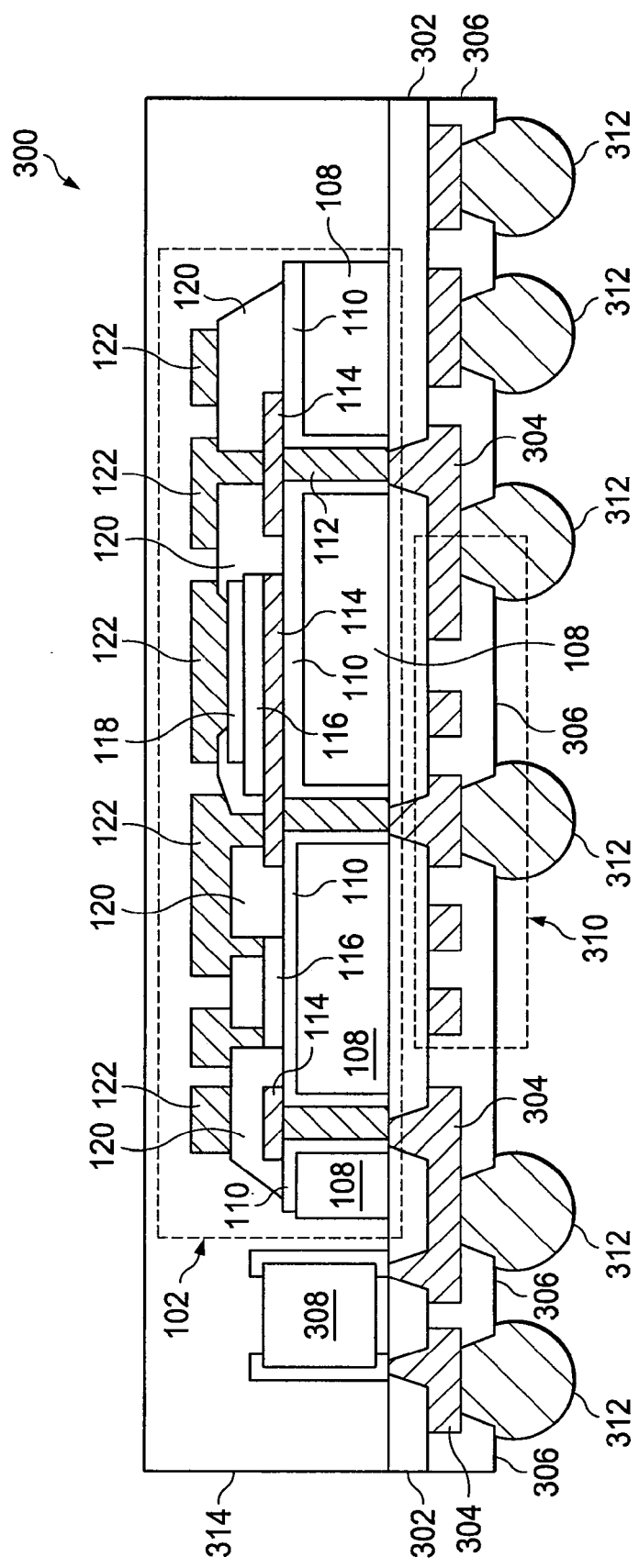
FIG. 5 illustrates a semiconductor device having a fan-out IPD structure, the IPD includes a plurality of exposed TSVs for backside interconnect.

FIG. 5 illustrates semiconductor device 300 having a fan-out IPD structure, the IPD includes a plurality of exposed TSVs for backside interconnect. IPD 102 is pre-fabricated and includes metal and dielectric layers to form various passive devices for integrating into semiconductor device 300. In the present embodiment, IPD 102 includes a capacitor and resistor. As shown in FIG. 5, IPD 102 includes semiconductor substrate 108. Vias are formed in substrate 108 using a DRIE, laser drilling, or other etching process. Insulation layer 110 is formed conformally over a surface of substrate 108 into the vias and includes one or more layers of SiO2, Si3N4, SiON, or another insulating material. A metal material is deposited into the vias to form TSVs 112. A backside of substrate 108 is removed to expose a portion of TSVs 112 at the backside of IPD 102. TSVs 112 metal can be made with Al, Cu, Sn, Ni, Au, or Ag or another conductive material suitable for deposition. Metal layer 114 is deposited over insulation layer 110 and TSVs 112. Metal layer 114 and TSV 112 metal may be formed concurrently, with a single layer of metal forming both TSVs 112 and metal layer 114. Resistive layer 116 is deposited over metal layer 114 and insulation layer 110 and includes TaxSiy or other metal silicides, TaN, NiCr, TiN, or doped poly-silicon. Dielectric layer 118 is deposited over resistive layer 116. Dielectric layer 118 can be SiN, Ta2O5, HfO2, or a dielectric film material. Insulation layer 120 is deposited over insulation layer 110, metal layer 114, resistive layer 116, and dielectric layer 118. Metal layer 122 includes a conductive material and is deposited over insulation layer 120 using a PVD, CVD, electrolytic plating, or electroless plating process. The combination of metal, insulation, dielectric, and resistive layers form one or more passive devices within IPD 102. In alternative embodiments, IPD 102 may include different combinations of passive devices, RF circuitry, or other electronic circuits to provide the necessary functionality of semiconductor device 300.

Depending upon the application, discrete components may be added to semiconductor device 300 to provide additional functionality. For example, with reference to FIG. 5, discrete component 308 is mounted next to IPD 102. Discrete component 308 includes passive or active components such as resistors, capacitors, inductors, or other electronic components.

Encapsulant 314, such as molding compound, is deposited over IPD 102 and discrete component 308. IPD 102 and discrete component 308 are mounted on a temporary carrier before encapsulation with encapsulant 314. Encapsulant 314 includes epoxy acrylate, other polymer material with proper fillers, or molding compound and is applied by transfer molding, liquid encapsulant molding, or other molding processes, or vacuum lamination.

Component 308 and IPD 102 are inverted and mounted to a temporary wafer carrier before encapsulation with encapsulant 314. Insulation layer 302 is deposited over molding compound 314, discrete component 308 and IPD 102 after removing the temporary carrier and adhesive layer. Insulation layer 302 is patterned to expose conductive regions of component 308 and IPD 102. Metal layer 304 is deposited and patterned over insulation layer 302 using a PVD, CVD, electrolytic plating, or electroless plating process. Metal layer 304 electrically interconnects IPD 102 and discrete component 308. Insulation layer 306 is deposited and patterned over metal layer 304 to expose portions of metal layer 304. As shown on FIG. 5, metal layer 304 forms an inductor (indicated by box 310) that is connected to the internal components of IPD 102 using TSVs 112.

An interconnect structure is formed over insulation layer 306. Bumps 312 include an electrically conductive material such as a solder material or other electrically conductive material. The solder material is deposited over the patterned regions of insulation layer 306 and is reflowed to form bumps 312. In alternative embodiments, other interconnect structures such as stud bumping, wirebonds or conductive pillars are connected to semiconductor device 300 to allow for the connection of external system components. In the present embodiment, the patterned regions of insulation layer 306 define the pad size for flip-chip or wirebonding interconnect to other system components or packages.

Figure 6:
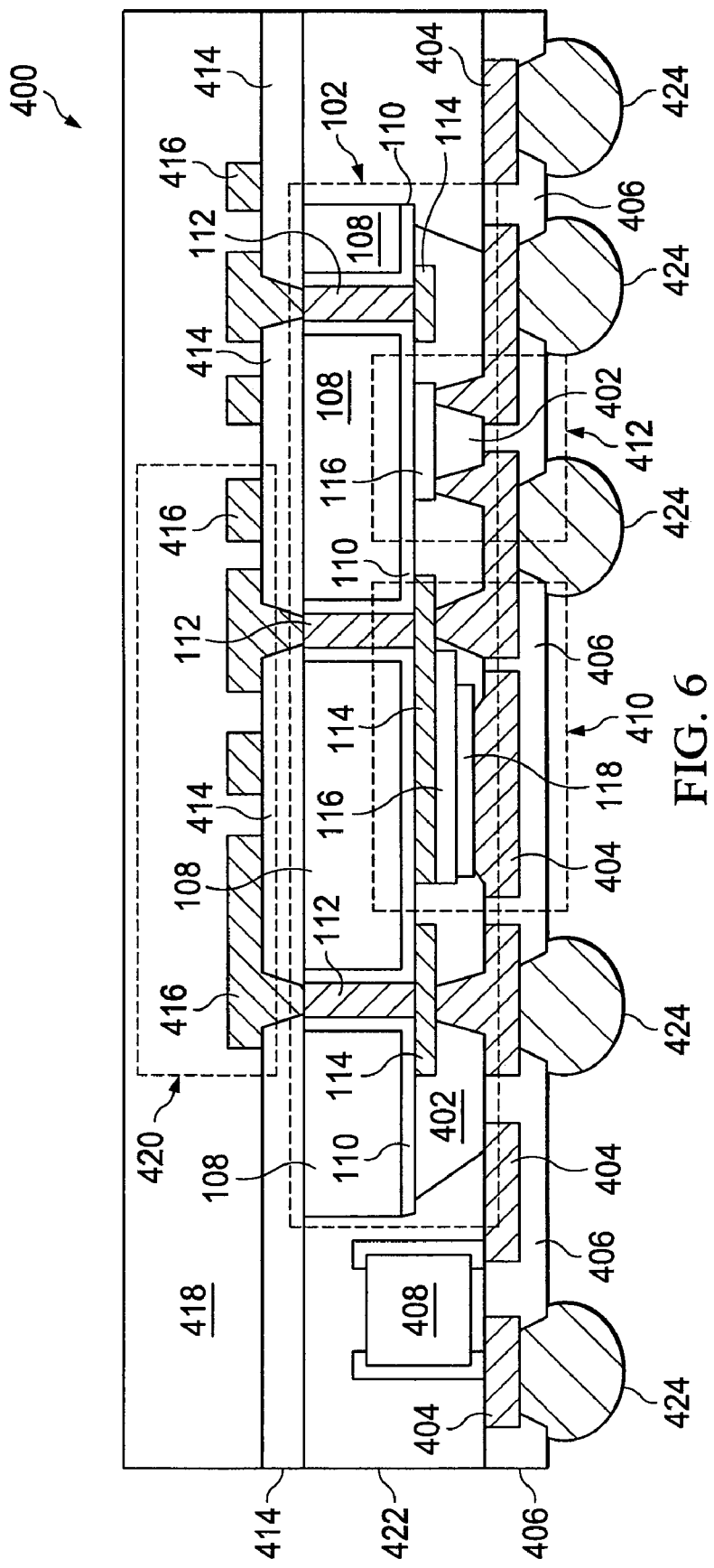
FIG. 6 illustrates a semiconductor device having a fan-out IPD structure and a metal layer deposited over the IPD to form the top electrode of a capacitor.

FIG. 6 illustrates semiconductor device 400 having a fan-out IPD structure and a metal layer deposited over the IPD to form the top electrode of the capacitor. Device 400 includes IPD 102. IPD 102 is pre-fabricated and includes metal and dielectric layers to form various passive devices for integrating into semiconductor device 400. In the present embodiment, IPD 102 includes a capacitor and resistor. As shown in FIG. 6, however, the top plate of the capacitor is not present and must be provided by a conductive structure external to IPD 102. IPD 102 includes semiconductor substrate 108. Vias are formed in substrate 108 using a DRIE, laser drilling, or other etching process. Insulation layer 110 is formed conformally over a surface of substrate 108 into the vias and includes one or more layers of SiO2, Si3N4, SiON, or another insulating material. A metal material is deposited into the vias to form TSVs 112 metal. A backside of substrate 108 is removed to expose a portion of TSVs 112 at the backside of IPD 102. TSVs 112 metal can be made with Al, Cu, Sn, Ni, Au, or Ag or another conductive material suitable for deposition. Metal layer 114 is deposited over insulation layer 110 and TSVs 112. Metal layer 114 and TSVs 112 metal may be formed concurrently, with a single layer of metal forming both TSVs 112 metal and metal layer 114. Resistive layer 116 is deposited over metal layer 114 and insulation layer 110 and includes TaxSiy or other metal silicides, TaN, NiCr, TiN, or doped poly-silicon. Dielectric layer 118 is deposited over resistive layer 116. Dielectric layer 118 can be SiN, Ta2O5, HfO2, or a dielectric film material. Insulation layer 402 is deposited over insulation layer 110, metal layer 114, resistive layer 116, and dielectric layer 118.

Depending upon the application, discrete components may be added to semiconductor device 400 to provide additional functionality. For example, with reference to FIG. 6, discrete component 408 is mounted next to IPD 102. Discrete component 408 includes passive or active components such as resistors, capacitors, inductors, or other electronic components.

Encapsulant 422, such as molding compound, is deposited over IPD 102 and discrete component 408. Encapsulant 422 includes epoxy acrylate, other polymer material with proper fillers, or molding compound and is applied by transfer molding, liquid encapsulant molding, vacuum lamination, or other molding processes. The deposition of encapsulant 422 is controlled to expose the backside of IPD 102 and TSVs 112. Alternatively, encapsulant 422 may be backgrinded to expose IPD 102 and TSVs 112. Insulation layer 414 is deposited over molding compound 422 and IPD 102. Insulation layer 414 is patterned to expose TSVs 112 of IPD 102. Metal layer 416 is deposited and patterned over insulation layer 414. Metal layer 416 is electrically connected to one or more TSV 112 of IPD 102. Insulation layer, molding compound, or laminator 418 is deposited or laminated over metal layer 416 and insulation layer 414 to provide electrical isolation and physical protection to device 400. As shown in FIG. 6, metal layer 416 forms an inductor structure indicated by box 420. The inductor is connected to the circuits formed within IPD 102 using TSVs 112.

Component 408 and IPD 102 in device 400 are mounted to a temporary wafer carrier before encapsulation with encapsulant 422. Metal layer 404 is deposited and patterned over discrete component 408 and IPD 102 after forming 418 and removing the temporary wafer carrier. Metal layer 404 is connected to the circuits formed within IPD 102 and discrete component 408. Insulation layer 406 is deposited over metal layer 404 and is patterned to expose portions of metal layer 404. As shown on FIG. 6, metal layer 404 forms the top electrode of the capacitor formed within IPD 102 (indicated by box 410). Metal layer 404 also forms a portion of a resistor device formed within IPD 102 (indicated by box 412).

An interconnect structure is formed over insulation layer 406. Bumps 424 include an electrically conductive material such as a solder material or other electrically conductive material. The solder material is deposited over the patterned regions of insulation layer 406 and is reflowed to form bumps 424. In alternative embodiments, other interconnect structures such as stud bumping, wirebonds or conductive pillars are formed over semiconductor device 400 to allow for the connection of external system components. In the present embodiment, the patterned regions of insulation layer 406 define the pad size for flip-chip or wirebonding interconnect to other system components or packages.

Figure 7:
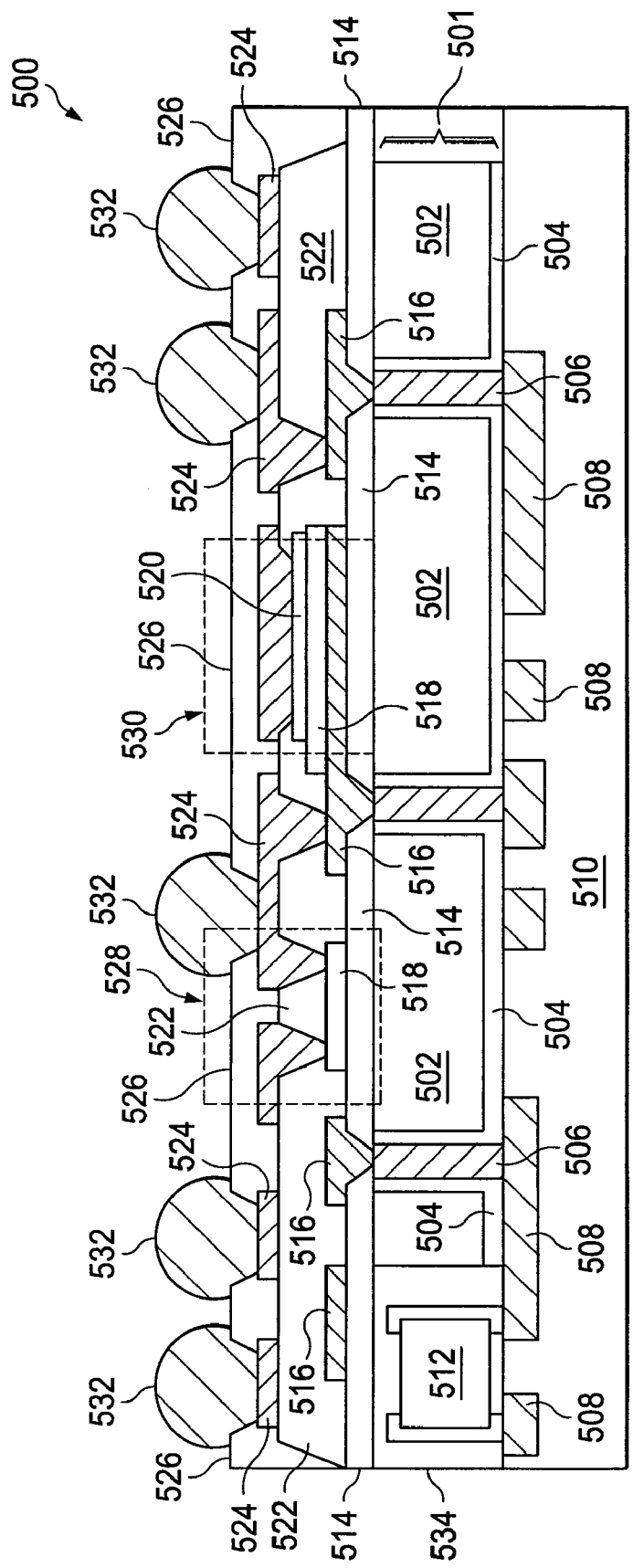
FIG. 7 illustrates a semiconductor device having a fan-out IPD structure including an IPD having a plurality of TSVs and a top-side interconnect structure.

FIG. 7 illustrates semiconductor device 500 having a fan-out IPD structure including an IPD having a plurality of TSVs and a top-side interconnect structure. IPD 501 is pre-fabricated and includes various passive devices, other circuits for integrating into semiconductor device 500, or no circuits and only TSVs. IPD 501 includes semiconductor substrate 502. Vias are formed in substrate 502 using a DRIE, laser drilling, or other etching process. Insulation layer 504 is formed conformally over a surface of substrate 502 into the vias and includes one or more layers of SiO2, Si3N4, SiON, or another insulating material. A metal material is deposited into the vias to form TSVs 506. A backside of substrate 502 is removed to expose a portion of TSVs 506 at the backside of IPD 501. TSVs 506 can be made with Al, Cu, Sn, Ni, Au, or Ag or another conductive material suitable for deposition.

Depending upon the application, discrete components may be added to semiconductor device 500 to provide additional functionality. For example, with reference to FIG. 7, discrete component 512 is mounted next to IPD 501. Discrete component 512 includes passive or active components such as resistors, capacitors, inductors, or other electronic components.

Molding compound or encapsulant 534 is deposited over discrete component 512 and IPD 501 to provide electrical isolation and mechanical protection. The deposition of molding compound 534 is controlled to expose a backside of IPD 501 and TSVs 506. Insulation layer 514 is deposited over molding compound 534 and IPD 501. Insulation layer 514 is patterned to expose TSVs 506 of IPD 501. Metal layer 516 is deposited and patterned over insulation layer 514 and TSVs 506. Resistive layer 518 is deposited over metal layer 516 and insulation layer 514 and includes TaxSiy or other metal silicides, TaN, NiCr, TiN, or doped poly-silicon. Alternatively, resistive layer 518 may be part of the adhesive layer in metal layer 516. In that case, resistive layer 518 is not formed on top of metal layer 516. Dielectric layer 520 is deposited over resistive layer 518. Dielectric layer 520 can be SiN, Ta2O5, HfO2, or a dielectric film material. Insulation layer 522 is deposited over insulation layer 514, metal layer 516, resistive layer 518, and dielectric layer 520. Metal layer 524 includes a conductive material and is deposited and patterned over insulation layer 522 using a PVD, CVD, electrolytic plating, or electroless plating process. Insulation layer 526 is deposited over metal layer 524 and is patterned to expose portion of metal layer 524.

The combination of metal, insulation, dielectric, and resistive layers form one or more passive devices over IPD 501. Box 528 indicates a resistor structure that includes portions of resistive layer 518 and metal layer 524. Box 530 indicates a capacitor structure formed over IPD 501 that includes portions of metal layer 516, resistive layer 518, dielectric layer 520 and metal layer 524. In alternative embodiments, IPD 501 may include different combinations of passive devices, RF circuitry, or other electronic circuits to provide the necessary functionality of semiconductor device 500. In alternative embodiments, metal layer 524 may be patterned to form additional passive circuit elements such as capacitors, inductors or resistors, depending upon system requirements.

Device 500 is inverted and metal layer 508 is deposited and patterned over molding compound 534, discrete component 512 and IPD 501. Metal layer 508 forms an interconnect structure to connect discrete component 512 and TSVs 506 of IPD 501. Depending upon the application, metal layer 508 may be patterned to form an inductor that is in electrical communication with either discrete component 512 or IPD 501. Insulation layer 510 is deposited over metal layer 508 to provide electrical insulation and physical protection. Insulation layer 510 may include a molding compound, or may be applied using a spin coating, printing, or laminating process.

An interconnect structure is formed over insulation layer 526. Solder or another conductive material is deposited over the patterned regions of insulation layer 526 and is reflowed to form bumps 532. In alternative embodiments, other interconnect structures such as stud bumping, wirebonds or conductive pillars are formed over semiconductor device 500 to allow for the connection of external system components. In the present embodiment, the patterned regions of insulation layer 526 define the pad size for flip-chip or wirebonding interconnect to other system components or packages. Alternatively, metal layer 508 and insulation layer 510 are formed in place of layers 514 to 532. Similarly, layers 514 to 532 may be formed in place of metal layer 508 and insulation layer 510 over opposing surfaces of IPD 502.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
  providing a temporary carrier for supporting the semiconductor device;
  mounting an integrated passive device (IPD) to the temporary carrier using an adhesive, the IPD including a capacitor and a resistor and having a plurality of through-silicon vias (TSVs);
  mounting a discrete component to the temporary carrier using the adhesive, the discrete component including a capacitor;
  encapsulating the IPD and the discrete component using a molding compound;

forming a first metal layer over the molding compound, the first metal layer being connected to the TSVs of the IPD and forming an inductor;

removing the temporary carrier and the adhesive;

forming a second metal layer over the IPD and the discrete component, the second metal layer interconnecting the IPD and the discrete component and forming an inductor, wherein the second metal layer forms an electrode of the capacitor of the IPD; and forming an interconnect structure over the second metal layer.

2. The method of claim 1, including:

depositing photoresist over the temporary carrier; and forming a seal ring between the photoresist and a surface of the IPD.

3. The method of claim 1, wherein the adhesive includes a light, heat or mechanically releasable material.

4. The method of claim 1, wherein the interconnect structure includes a plurality of solder bumps.

5. The method of claim 1, further including backgrinding the IPD to expose the TSVs of the IPD, the step of backgrinding the IPD including chemical-mechanical polishing (CMP), wet etching, or plasma etching.

6. The method of claim 1, wherein the temporary carrier includes a glass wafer having a laser-releasable layer.

7. A method of making a semiconductor device, comprising:

providing an integrated passive device (IPD), the IPD including a capacitor and a resistor and having a plurality of conductive vias;

providing a discrete component disposed proximate to the IPD, the discrete component including a capacitor;

encapsulating the IPD and the discrete component using a molding compound;

forming a first metal layer over the molding compound, the first metal layer being connected to the conductive vias of the IPD and forming an inductor;

forming a second metal layer over the IPD and the discrete component, the second metal layer interconnecting the IPD and the discrete component, wherein the second metal layer forms an electrode of the capacitor of the IPD; and forming an interconnect structure over the second metal layer.

8. The method of claim 7, wherein the second metal layer forms an inductor.

9. The method of claim 7, wherein the discrete component has a capacitance greater than 100 picofarads (pF).

10. The method of claim 7, wherein the interconnect structure includes a plurality of solder bumps.

11. The method of claim 7, further including backgrinding the IPD to expose the TSVs of the IPD, the step of backgrinding the IPD including chemical-mechanical polishing (CMP), wet etching, or plasma etching.

12. A method of making a semiconductor device, comprising:

providing an integrated passive device (IPD), the IPD including a plurality of conductive vias;

providing a discrete component disposed proximate to the IPD;

forming a metal layer over the IPD and the discrete component, the metal layer interconnecting the IPD and the discrete component, wherein the metal layer forms an electrode of a capacitor formed within the IPD; and forming an interconnect structure over the metal layer.

13. The method of claim 12, wherein the metal layer forms an inductor.

14. The method of claim 12, wherein the discrete component includes a capacitor and has a capacitance greater than 100 picofarads (pF).

15. The method of claim 12, wherein the interconnect structure includes a resistor.

16. The method of claim 12, further including backgrinding the IPD to expose a TSV formed within the IPD, the step of backgrinding the IPD including chemical-mechanical polishing (CMP), wet etching, or plasma etching.

* * * * *